US012662371B2

(12) United States Patent
Duca

(10) Patent No.: US 12,662,371 B2
(45) Date of Patent: Jun. 23, 2026

(54) DECOUPLING METHOD FOR SEMICONDUCTOR DEVICE

(71) Applicant: STMicroelectronics International N.V., Geneva (CH)

(72) Inventor: Roseanne Duca, Ghaxaq (MT)

(73) Assignee: STMicroelectronics International N.V., Geneva (CH)

( * ) Notice: Subject to any disclaimer, the term of this patent is extended or adjusted under 35 U.S.C. 154(b) by 697 days.

(21) Appl. No.: 17/973,084

(22) Filed: Oct. 25, 2022

(65) Prior Publication Data

US 2024/0132340 A1    Apr. 25, 2024
US 2024/0228264 A9    Jul. 11, 2024

(51) Int. Cl.
　*B81B 3/00*　　　(2006.01)
　*B81C 1/00*　　　(2006.01)
　*H10W 70/02*　　　(2026.01)
　*H10W 70/20*　　　(2026.01)
　　　　(Continued)

(52) U.S. Cl.
　CPC ........ *B81B 3/0072* (2013.01); *B81C 1/00666* (2013.01); *H10W 70/023* (2026.01);
　　　　(Continued)

(58) Field of Classification Search
　CPC .......... B81B 3/0072; B81B 2201/0235; B81B 2201/0242; B81B 2207/012; B81B 2207/015; B81B 2207/07; B81B 2207/096; B81B 3/00; B81C 1/00666; B81C 2203/038; B81C 2203/0771; B81C 1/00; H01L 23/4924; H01L 24/48;
　　　　(Continued)

(56) References Cited

U.S. PATENT DOCUMENTS 9,446,940 B2　9/2016　Dawson et al.
10,329,141 B2　6/2019　Tocchio et al.
(Continued)

FOREIGN PATENT DOCUMENTS

CA　　2366999　　*　3/2000
CN　210108566 U　　2/2020
CN　114878058 A　　8/2022

OTHER PUBLICATIONS

Schubring, Adam, et al: "Ceramic Package Solutions for MEMS Sensors," Int'l Electronics Manufacturing Technology Symposium, 2007, IEEE, 5 pgs.

*Primary Examiner* — Timor Karimy
(74) *Attorney, Agent, or Firm* — Crowe & Dunlevy LLC

(57) ABSTRACT

A sensor package includes a packaging formed by a package bottom, first and second sidewalls extending upwardly from first and second opposite sides of the package bottom, and third and fourth sidewalls extending upwardly from third and fourth opposite sides of the package bottom, the sidewalls and package bottom defining a cavity. An integrated circuit is attached to the package bottom. A plate extends between two of the sidewalls within the cavity and is spaced apart from the package bottom. Sensors are attached to a top surface of the plate on opposite sides of an opening. Wire bondings electrically connect pads on a top face of the sensor to corresponding pads on a top face of the integrated circuit, for example by passing through the opening in the plate or passing past a side end of the plate. A lid extends across and between the sidewalls to close the cavity.

19 Claims, 9 Drawing Sheets

(51) Int. Cl.

| | |
|---|---|
| *H10W 72/00* | (2026.01) |
| *H10W 72/50* | (2026.01) |
| *H10W 76/17* | (2026.01) |
| *H10W 90/00* | (2026.01) |

(52) U.S. Cl.
CPC .......... *H10W 70/24* (2026.01); *H10W 90/00* (2026.01); *B81B 2201/0235* (2013.01); *B81B 2201/0242* (2013.01); *B81B 2207/012* (2013.01); *B81B 2207/015* (2013.01); *B81B 2207/07* (2013.01); *B81B 2207/096* (2013.01); *B81C 2203/038* (2013.01); *B81C 2203/0771* (2013.01); *H10W 72/01* (2026.01); *H10W 72/07552* (2026.01); *H10W 72/521* (2026.01); *H10W 72/823* (2026.01); *H10W 76/17* (2026.01); *H10W 90/752* (2026.01); *H10W 90/753* (2026.01); *H10W 90/754* (2026.01)

(58) Field of Classification Search
CPC ............. H01L 25/0652; H01L 25/0655; H01L 25/0657; H01L 25/50; H01L 2224/48091; H01L 2224/48137; H01L 2224/48145; H01L 2224/48227; H01L 2225/06506; H01L 2225/0651; H01L 2225/06527; H01L 2225/06548; H01L 2924/1433; H01L 2924/1461; H01L 2924/16195; H01L 2924/16251; H01L 2924/167; H10W 70/02; H10W 70/20; H10W 90/00; H10W 72/00; H10W 72/50; H10W 76/17
See application file for complete search history.

(56) References Cited

U.S. PATENT DOCUMENTS

| | | | |
|---|---|---|---|
| 2018/0313709 A1* | 11/2018 | Chiou | ................... B81B 7/0061 |
| 2021/0380403 A1 | 12/2021 | Zhang et al. | |
| 2022/0260606 A1 | 8/2022 | Malvern et al. | |
| 2022/0321071 A1* | 10/2022 | Noori | ..................... H03F 3/195 |

* cited by examiner

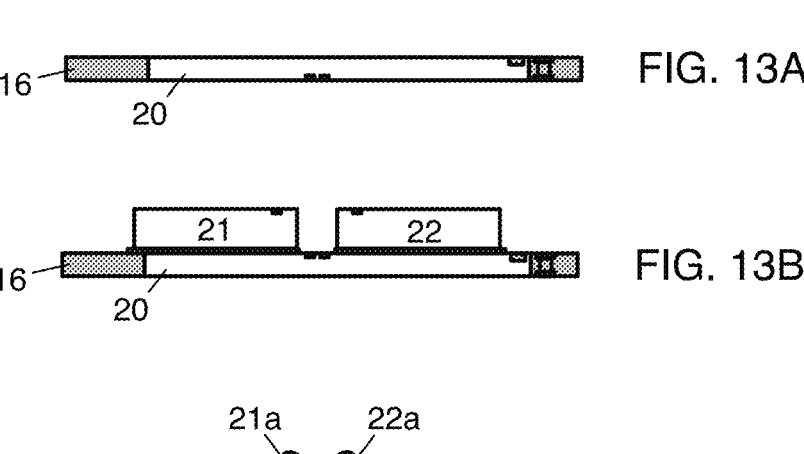
FIG. 13A
FIG. 13B
FIG. 13C
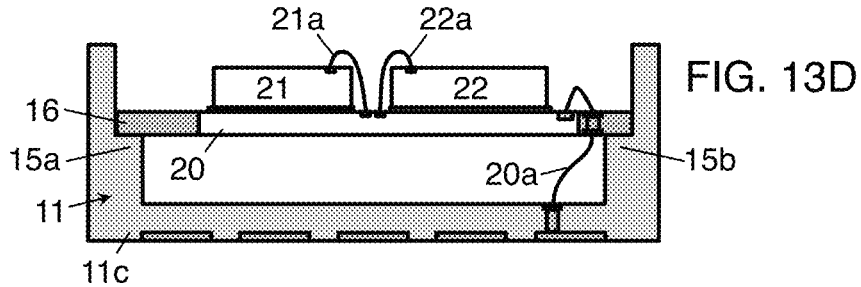
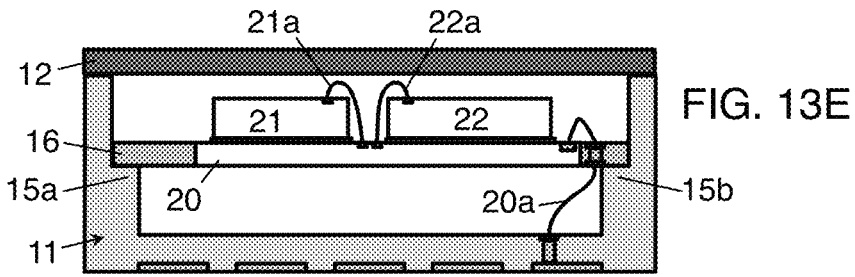
FIG. 13D
FIG. 13E

DECOUPLING METHOD FOR SEMICONDUCTOR DEVICE

TECHNICAL FIELD

This disclosure is directed to the field of packaging for sensors and, in particular, to packages that decouple sensors within the packages from mechanical stresses placed on the packages themselves.

BACKGROUND

Certain sensors, such as microelectromechanical systems (MEMS) sensors, are typically packaged together with an application specific integrated circuit (ASIC). In such a sensing package, a challenge in the packaging is to provide for long-term stability and operation, and to reduce mechanical stresses placed on the sensors, for example, during manufacturing steps such as soldering or due to mismatches in the coefficient of thermal expansion (CTE) between the sensors and the package.

Ceramics are known to have mechanical properties that make them advantageous for use in packages carrying semiconductor-based sensors. For example, ceramics are rigid in nature and their properties exhibit stability over time. In addition, different ceramics with a variety of different CTEs are available, making the matching between CTEs of the packages and the sensors easier. Where a mismatch is present, due to expansion over temperature at different rates between the packages in question and the sensors, mechanical stresses are imposed on the sensors. These sensors may have mechanical components integrated therein and are therefore particularly sensitive to mechanical stresses, with such stresses potentially reducing the stability and lifetime of the sensors and possibly altering the performance of the sensors. Therefore, the use of ceramic packaging materials matched in CTE to the sensors is of interest.

A specific challenge faced during manufacture of sensing packages is that mechanical stress levels on the packages themselves after being soldered to a printed circuit board (PCB) may be high and such stresses may be coupled through to the sensors, causing drifting of the performance of the sensors as a result of the mechanical stresses applied thereto.

Another challenge is that sensors are often calibrated after a final test, compensating for drift caused by process variations (both front-end and back-end) but prior to being soldered to a PCB and, as stated, the soldering itself may induce stresses and result in drift. It is therefore desired for package designs to be created that that are able to decouple the sensors themselves from the stresses placed on their packages.

SUMMARY

Disclosed herein is a sensor package including a packaging and an integrated circuit. The packaging is formed by a package bottom, first and second sidewalls extending upwardly from first and second opposite sides of the package bottom, and third and fourth sidewalls extending upwardly from third and fourth opposite sides of the package bottom. The first, second, third, and fourth sidewalls and the package bottom define a cavity. The integrated circuit is attached to the package bottom. A plate extends between at least two of the sidewalls within the cavity and is spaced apart from the package bottom. At least one sensor is attached to a top surface of the plate. Wire bondings electrically connect pads on a top face of the at least one sensor to corresponding pads on a top face of the integrated circuit. A lid extends across and between the first, second, third, and fourth sidewalls to thereby close the cavity.

The plate may extend between the first and second sidewalls and may have an opening formed therein through which the wire bondings pass to electrically connect the pads on the top face of the at least one sensor to the corresponding pads on the top face of the integrated circuit.

The first sidewall may be formed by a first portion extending upwardly from the first side of the package bottom and a second portion extending upwardly from a distal end of the first portion, with the second portion being thinner than the first portion in a stair-stepped shape so as to define a first support shelf. The second sidewall may be formed by a first portion extending upwardly from the second side of the package bottom and a second portion extending upwardly from a distal end of the second portion, with the second portion of the second sidewall being thinner than the first portion of the second sidewall in a stair-stepped shape so as to define a second support shelf.

The plate may be carried by and extends between the first and second support shelves.

The plate extend between the first and second sidewalls and have an opening formed therein, with the at least one sensor being first and second sensors attached to the top surface of the plate on opposite sides of the opening. In this situation, the wire bondings may include first and second wire bondings. The first wire bondings may pass through the opening to electrically connect the pads on the top face of the first sensor to the corresponding pads on the top face of the integrated circuit. The second wire bondings may pass through the opening to electrically connect the pads on the top face of the second sensor to the corresponding pads on the top face of the integrated circuit.

The packaging and plate may be constructed from ceramic.

The lid may be constructed from metal.

The integrated circuit may be an application specific integrated circuit (ASIC).

Vias may be formed within the package bottom to electrically connect pads on a top surface of the package bottom to corresponding pads on a bottom surface of the package bottom, and additional wire bondings may electrically connect the pads on the top surface of the package bottom to corresponding pads on the top face of the integrated circuit.

The plate may extend between the third and fourth sidewalls, adjacent to the first sidewall. In this instance, the wire bondings may extend past a side end of the plate to electrically connect the pads on the top face of the at least one sensor to the corresponding pads on the top face of the integrated circuit.

The plate may be sized to extend outwardly from the first sidewall toward the second sidewall but not reach the second sidewalls.

The first sidewall may be formed by a first portion extending upwardly from the first side of the package bottom and a second portion extending upwardly from a distal end of the first portion, with the second portion being thinner than the first portion in a stair-stepped shape so as to define a first support shelf, and the plate may be carried by the first support shelf.

The second sidewall may have a substantially constant thickness.

The plate may extend between the third and fourth sidewalls, adjacent to the first sidewall, with the plate being sized to extend outwardly from the first sidewall toward the second sidewall but not reach the second sidewall. In this instance, the at least one sensor may be first and second sensors attached to the top surface of the plate. Together with this, the wire bondings may be first and second wire bondings. The first wire bondings may extend past a side end of the plate to electrically connect the pads on the top face of the first sensor to the corresponding pads on the top face of the integrated circuit. The second wire bondings may extend past the side end of the plate to electrically connect the pads on the top face of the second sensor to the corresponding pads on the top face of the integrated circuit.

Also disclosed herein is a method of making the devices described above. The method may include steps of: a) attaching an integrated circuit to a top surface of a package bottom of a package; b) attaching at least one sensor to a top surface of a plate on opposite sides of an opening formed in the plate; c) mounting the plate between sidewalls of the package in a spaced apart fashion from the top surface of the package bottom; d) electrically connecting pads on a top face of the at least one sensor to corresponding pads on a top face of the integrated circuit using wire bondings; and e) affixing a lid to extend across and between the sidewalls to thereby close a cavity within the package defined by the sidewalls and the package bottom.

Electrically connecting the pads on the top face of the at least one sensor to the corresponding pads on the top face of the integrated circuit may include passing the wire bondings through an opening in the plate.

The method may include, prior to a), providing the package as having a package bottom, first and second sidewalls extending upwardly from first and second opposite sides of the package bottom, and third and fourth sidewalls extending upwardly from third and fourth opposite sides of the package bottom. In c), the plate may be mounted to extend at least between the first and second sidewalls.

The package may be provided as having the first sidewall formed by a first portion extending upwardly from the first side of the package bottom and a second portion extending upwardly from a distal end of the first portion, with the second portion being thinner than the first portion in a stair-stepped shape so as to define a first support shelf, and as having the second sidewall formed by a first portion extending upwardly from the second side of the package bottom and a second portion extending upwardly from a distal end of the second portion, with the second portion of the second sidewall being thinner than the first portion of the second sidewall in a stair-stepped shape so as to define a second support shelf. Together with this in c), the plate may be mounted between the sidewalls of the package by affixing a bottom surface of the plate to the first and second support shelves.

The method may include prior to c), electrically connecting pads on the top surface of the package bottom to corresponding pads on the top face of the integrated circuit using third wire bondings.

Electrically connecting the pads on the top face of the at least one sensor to the corresponding pads on the top face of the integrated circuit may include passing the wire bondings past a side end of the plate.

The method may also include, prior to a), providing the package as having a package bottom, first and second sidewalls extending upwardly from first and second opposite sides of the package bottom, and third and fourth sidewalls extending upwardly from third and fourth opposite sides of the package bottom. In this instance, in c), the plate may be mounted to extend from the first sidewall.

The package may be provided as having the first sidewall formed by a first portion extending upwardly from the first side of the package bottom and a second portion extending upwardly from a distal end of the first portion, with the second portion being thinner than the first portion in a stair-stepped shape so as to define a first support shelf. In c), the plate may be mounted between the sidewalls of the package by affixing a bottom surface of the plate to the first support shelf.

BRIEF DESCRIPTION OF THE DRAWINGS

FIG. 13A is a cross sectional view of the ceramic plate of the sensor package of FIG. 12 during manufacture, with the ceramic plate having the ASIC embedded therein.

FIG. 13B is a cross sectional view of the ceramic plate of the sensor package of FIG. 12 during manufacture with first and second sensors mounted to the top surface of the ceramic plate.

FIG. 13C is a cross sectional view of the sensor package of FIG. 12 during manufacture after wire bonding has been formed between the sensors and the ASIC.

FIG. 13D is a cross sectional view of the sensor package of FIG. 12 during manufacture after the ceramic plate has been mounted on the supports defined within the sensor package and wire bonding has been formed between the plate and the bottom of the sensor package.

FIG. 13E is a cross sectional view of the sensor package of FIG. 12 during manufacture after the lid has been affixed to the package.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. In addition, in the below description, where any individual wire bonding connecting two pads is described, understand there may instead be multiple such wire bondings connected between a corresponding number of pads on the same surfaces/faces/devices in the same fashion.

Now described with initial reference to FIGS. 1-4 is a sensor package 10. The sensor package 10 includes a package 11 that is shaped as a rectangular box with an open top defining a cavity 19, with a lid 12 affixed over the open top of the package 11 to close the cavity 19. The package 11 is constructed from ceramic and the lid 12 is constructed from either metal or ceramic.

Figure 1:
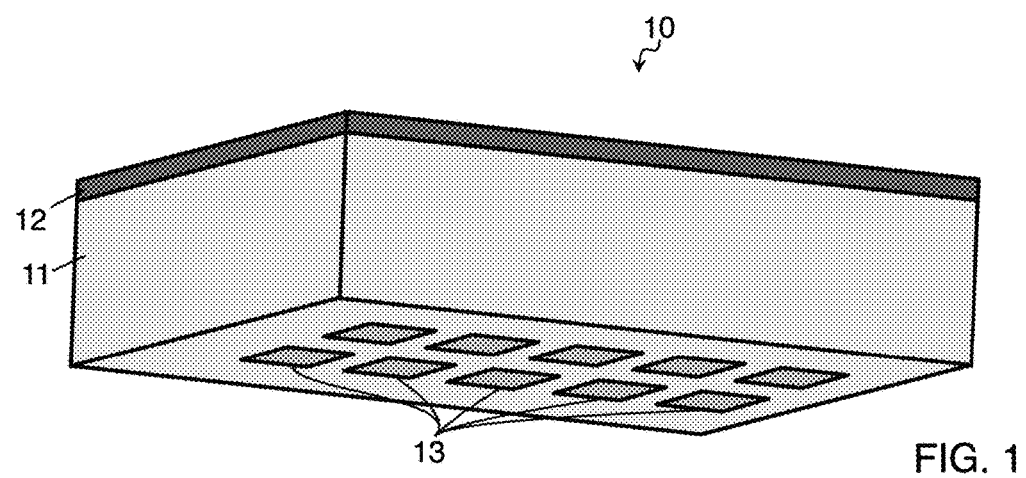
FIG. 1 is a perspective view of a sensor package described herein.
Figure 2:
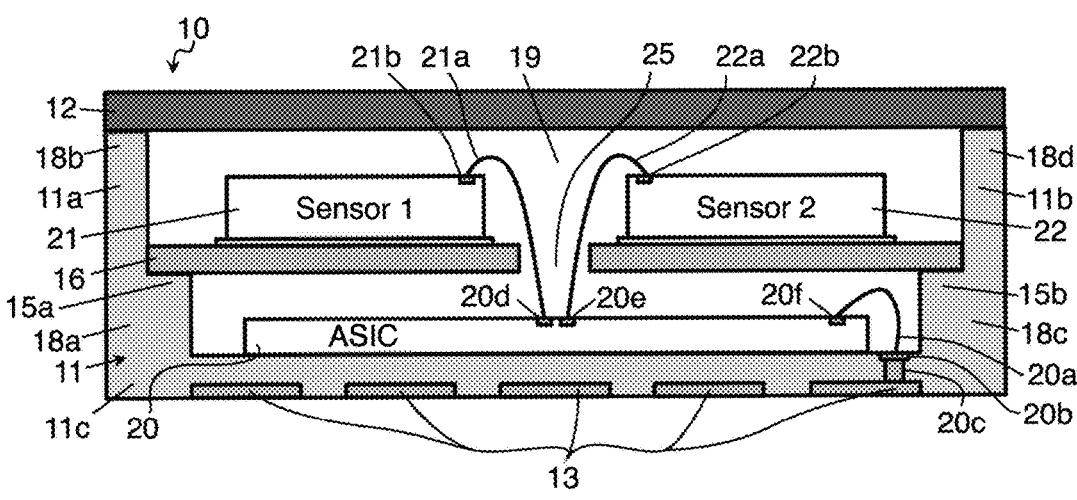
FIG. 2 is a cross sectional view of a sensor package described herein, showing the mounting of the sensors and ASIC within the package.

The interior of the package 11 includes four sidewalls, with two of the sidewalls 11a, 11b opposite each other across the bottom 11c of the package 11 being shown in the cross section of FIG. 2, and the two other sidewalls not being shown but have, in an embodiment, a shape and configuration like that of sidewalls 11a, 11b. The sidewall 11a is formed as a thick portion 18a extending upwardly from the package bottom 11c and a thin portion 18b extending upwardly from the thick portion 18a in a stair-stepped shape to define a support shelf 15a. Similarly, the sidewall 11b is formed as a thick portion 18c extending upwardly from the package bottom 11c and a thin portion 18d extending upwardly from the thin portion 18c in a stair-stepped shape to define a support shelf 15b. A plate 16 is supported within the cavity 19 by the support shelves 15a, 15b that the bottom surface of the plate 16 is adhesively bonded to, with the plate extending between the support shelves 15a, 15b. The plate 16 is sized to fully close off a lower portion of the cavity 19 (the lower portion of the cavity being the portion of the cavity below the support shelves 15a, 15b) and has an opening 25 defined therein.

An application specific integrated circuit (ASIC) 20 is attached to the upper surface of the package bottom 11c, with wire bonding 20a connecting pad 20f on the top face of the ASIC 20 to pad 20b and via 20c within the package bottom 11c of the package that are in turn connected to dual-flat no lead (DFN) pad 13 on the bottom surface of the package bottom 11c. A first sensor 21 is attached to the top surface of the plate 16 adjacent the support shelf 15a, and a second sensor 22 is attached to the top surface of the plate 16 adjacent the support shelf 15b. The first sensor 21 may be a microelectromechanical systems (MEMS) device such as an accelerometer, and the second sensor 22 may be another MEMS device such as a gyroscope. Indeed, the sensors 21, 22 are silicon based and may be any suitable sensors that either include mechanical components (e.g., MEMS components, optical components, etc.) or electrical components sensitive to the piezoelectric effect (e.g., at least one piezoresistor and/or a Hall effect sensor).

A wire bonding 21a passes through the opening 25 in the plate 16 to connect pad 21b on the top face of the sensor 21 to corresponding pad 20d on the top face of the ASIC 20, and a wire bonding 22a passes through the opening 25 in the plate 16 to connect pad 22b on the top face of the sensor 22 to corresponding pad 20e on the top face of the ASIC 20.

Figures 3, 4:
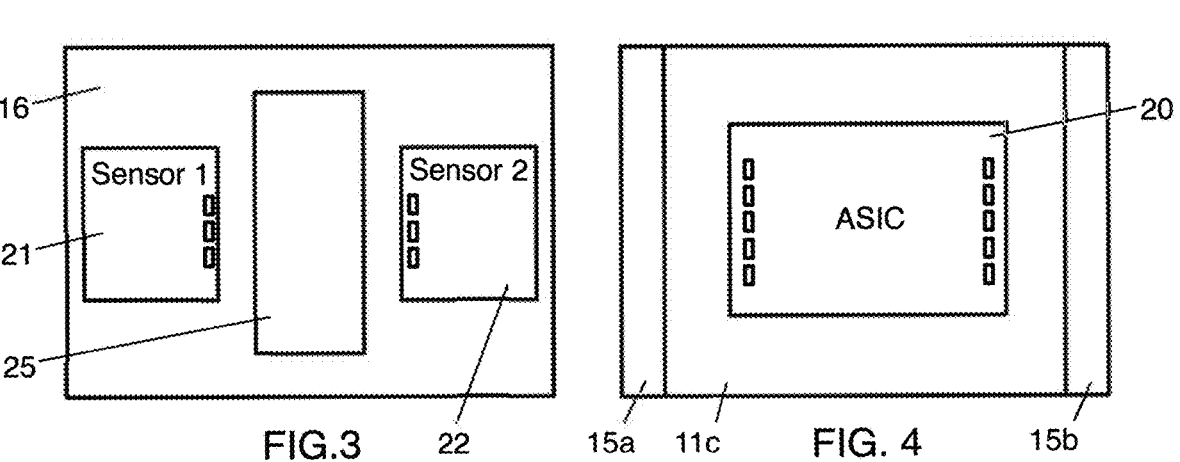
FIG. 3 is a top view of the sensor package of FIG. 2 with the lid removed.
FIG. 4 is a top view of the sensor package of FIG. 2 with the ceramic plate removed.

To ease a full understanding, a top plan view of the plate 16 with the sensors 21, 22 attached to the top surface thereof opposite to each other across the opening 25 is shown in FIG. 3, with the various wire bondings not being shown for ease of reading. Likewise, a top plan view of the package bottom 11c showing the placement of the ASIC 20 and the support shelves 15a, 15b is shown in FIG. 4, with the various wire bondings not being shown for ease of reading.

As a result of soldering the sensor package 10 to a printed circuit board (PCB), mechanical stresses (e.g., normal and/or shear stresses, generally lateral but also out of plane) are applied to the sensor package 10. The advantage of the design of the sensor package 10 is that while mechanical stresses placed on the package 11 are imparted to the package bottom 11c through the mechanical connection to the PCB, those mechanical stresses are not ultimately passed through to the plate 16, and are therefore not imparted to the sensors 21, 22 on the top surface of the plate 16. While the ASIC 20 will be subjected to the stresses imparted to the package 11 (which are transmitted to the ASIC 20 through its connection to the top surface of the package bottom 11c), the ASIC contains solely electrical components and does not contain mechanical components, and as such its proper operation is not impacted.

This design of the sensor package 10 therefore results in a significant reduction in stresses passed to the sensors 21, 22, contributing to a longer service life and more predictable behavior. In addition, the performance of the sensors 21, 22 themselves may be increased, as their performance will be similar to what it would be if the sensor package 10 was a standalone device and not attached to a PCB. This in turn may help reduce the amount of testing to be performed.

Additional designs and process flows for forming those designs (as well as the design of FIG. 2) will be described below, with it being understood that those designs have the same benefits and advantages as that of the sensor package 10 of FIG. 2 described hereinabove.

Figure 5:
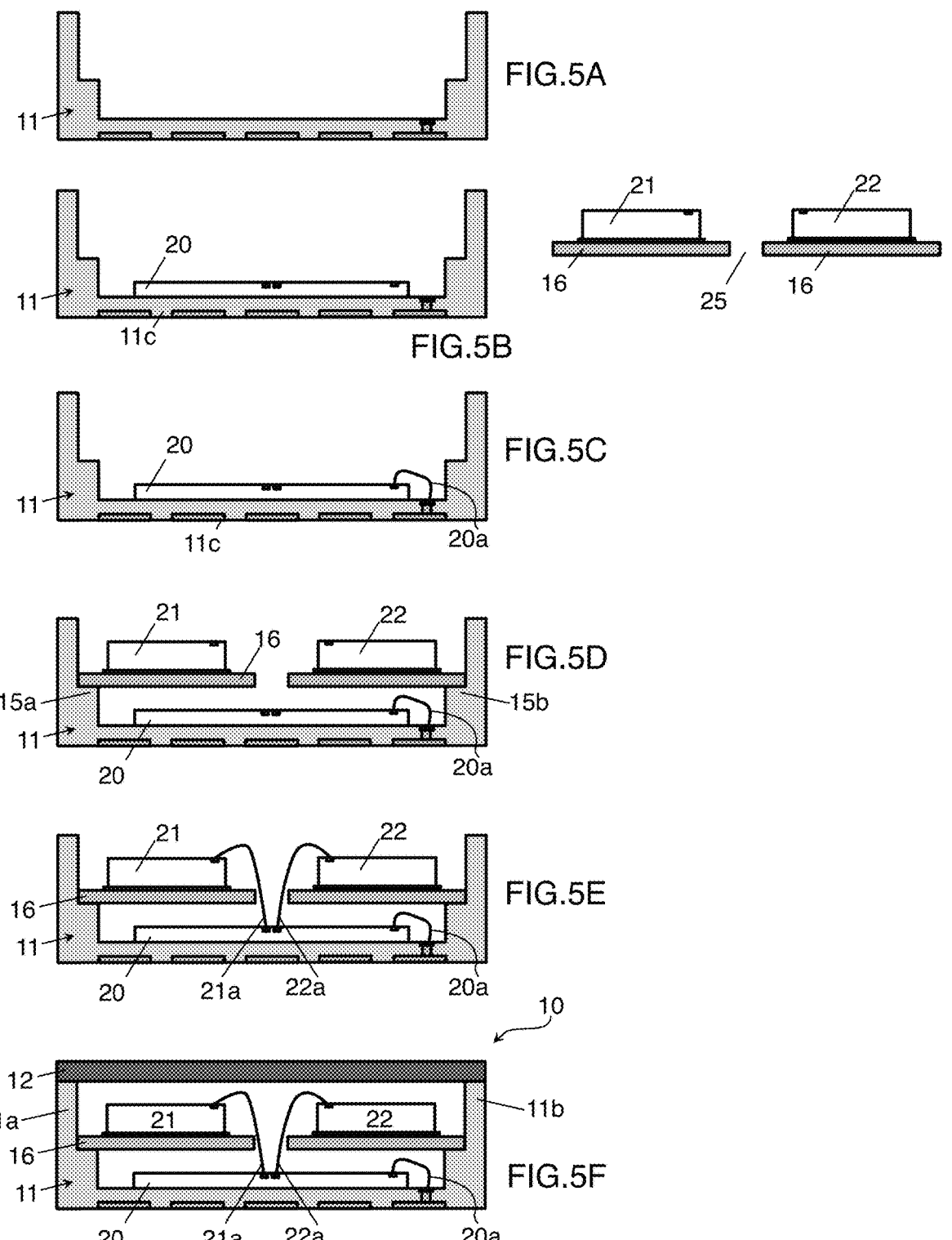
FIG. 5A is a cross sectional view of the package itself of the sensor package of FIG. 2 at the beginning of a manufacturing process flow.
FIG. 5B is a cross sectional view of the sensor package of FIG. 2 during manufacturing with the ASIC mounted to the top surface of the bottom of the package.
FIG. 5C is a cross sectional view of the sensor package of FIG. 2 during manufacture after wire bonding has been formed between pads on the ASIC and pads on the bottom of the package.
FIG. 5D is a cross sectional view of the sensor package of FIG. 2 during manufacture, with the ceramic plate carrying the sensors having been mounted on the supports defined within the sensor package.
FIG. 5E is a cross sectional view of the sensor package of FIG. 2 during manufacture after wire bonding has been formed between pads on the sensors and the pads on ASIC.
FIG. 5F is a cross sectional view of the sensor package of FIG. 2 during manufacture after the lid has been affixed to the package.

Now described with reference to FIGS. 5A-5F is a process flow for forming the sensor package 10 of FIG. 2. The process flow begins with the provision or formation of the package 11, as shown in FIG. 5A. Thereafter, the ASIC 20 is attached to the top surface of the package bottom 11c and the sensors 21, 22 are attached to the top surface of the plate 16 on opposite sides of the opening 25, as shown in FIG. 5B.

Wire bonding 20a is then used to connect pad 20f on the top face of the ASIC 20 to corresponding pad 20b and via 20c on the top surface of the package bottom 11c, as shown in FIG. 5C, and then the assembled plate 16 is mounted within the package 11 such that it is affixed to and extends between the support shelves 15a, 15b, as shown in FIG. 5D. This mounting of the plate 16 is accomplished by dispensing adhesive on the support shelves 15a, 15b, positioning the plate 16 into the appropriate place, and then performing a curing. Next, wire bondings 21a, 22a are passed through the opening 25 and used to connect pads 21b, 22b on the top faces of the sensors 21, 22 to corresponding pads 20d, 20e on the top face of the ASIC 20, as shown in FIG. 5E. As should be understood, the opening 25 is sized and shaped so as to provide access to the top face of the ASIC 20 and allow for the wirebonding tool to form the desired wire bond connections.

The lid 12 is then affixed over the tops of the sidewalls 11a, 11b to seal off the cavity 19 within the package 11, as shown in FIG. 5F. This completes the formation of the sensor package 10.

Figures 6, 7, 8:
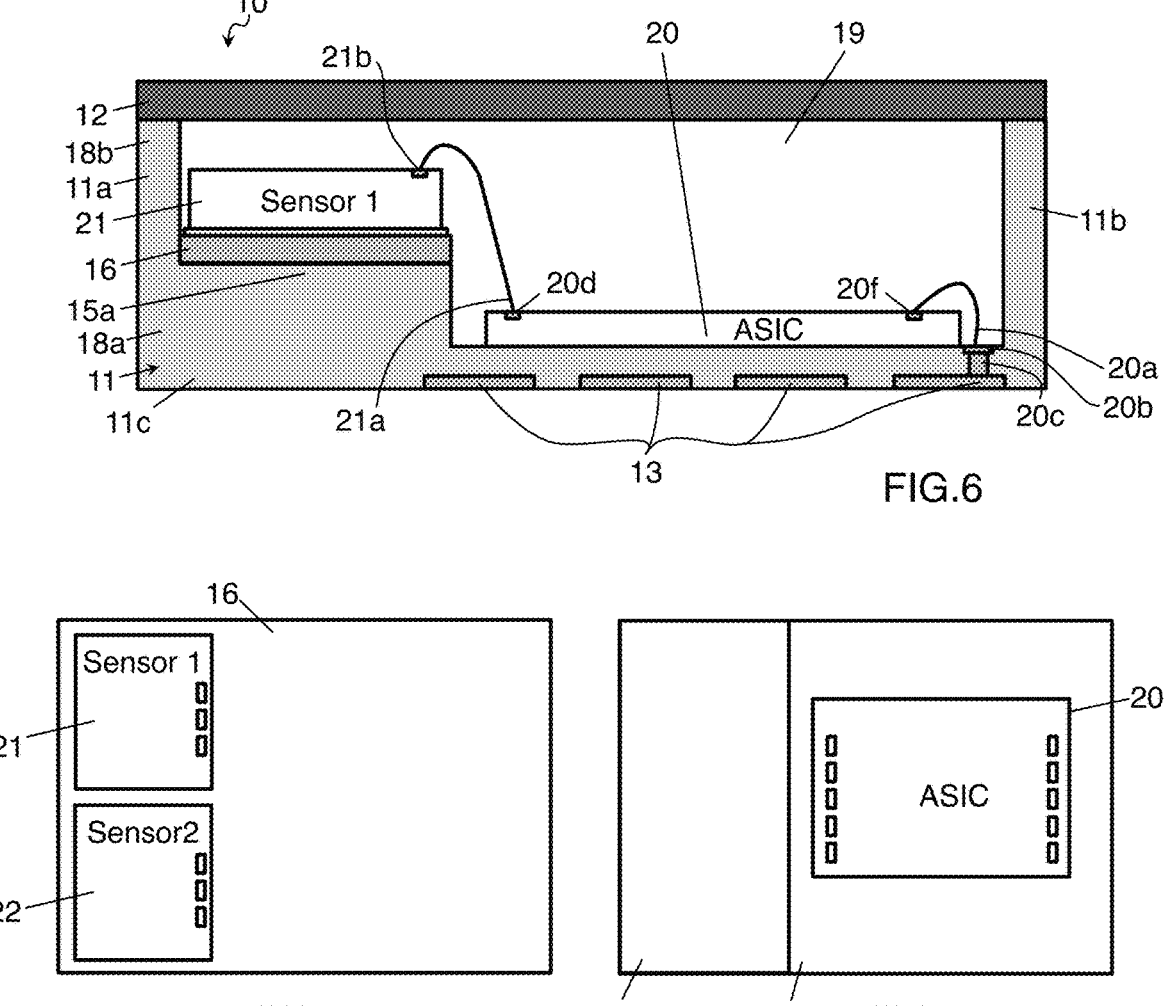
FIG. 6 is a cross sectional view of a variation of the sensor package of FIG. 2 in which the ceramic plate does not extend completely across the interior of package and instead forms a shelf carrying the sensors.
FIG. 7 is a top view of the sensor package of FIG. 6 with the lid removed.
FIG. 8 is a top view of the sensor package of FIG. 6 with the ceramic plate removed.

An alternative to the design of the sensor package 10 is now described with reference to FIG. 6. In this alternative, instead of the plate 16 extending completely across the cavity 19 between shelves 15a, 15b, the plate 16 may be shorter in length and affixed to just one shelf 15a, as shown in the sensor package 10' of FIG. 6. Notice that in this instance, the sidewall 11b is constant in thickness, and the shelf 15b (of FIG. 2) is not present. Again, the other sidewalls are not shown but in an embodiment may be constructed similar to each sidewall 11a or sidewall 11b.

Through this design, an opening need not be formed in the plate 16 since a portion of the chamber will be left open adjacent the plate 16. Thus, here, the wire bondings 21a, 22b extend past the side end of the shelf 15a to connect pads 21b, 22b on the top faces of the sensors 21, 22 to corresponding pads 20d, 20e on the top face of the ASIC 20. As can be observed in the top plan view of the plate 16 in FIG. 7, both sensors 15a, 15b are carried by the plate 16 adjacent the sidewall 11a. In addition, as can be observed in the top plan view of the package bottom 11c in FIG. 8, the ASIC 20 is positioned adjacent to the sidewall 11b to permit the wire bondings 21a, 22b to easily reach its pads.

Figures 9A, 9B, 9C, 9D, 9E, 9F:
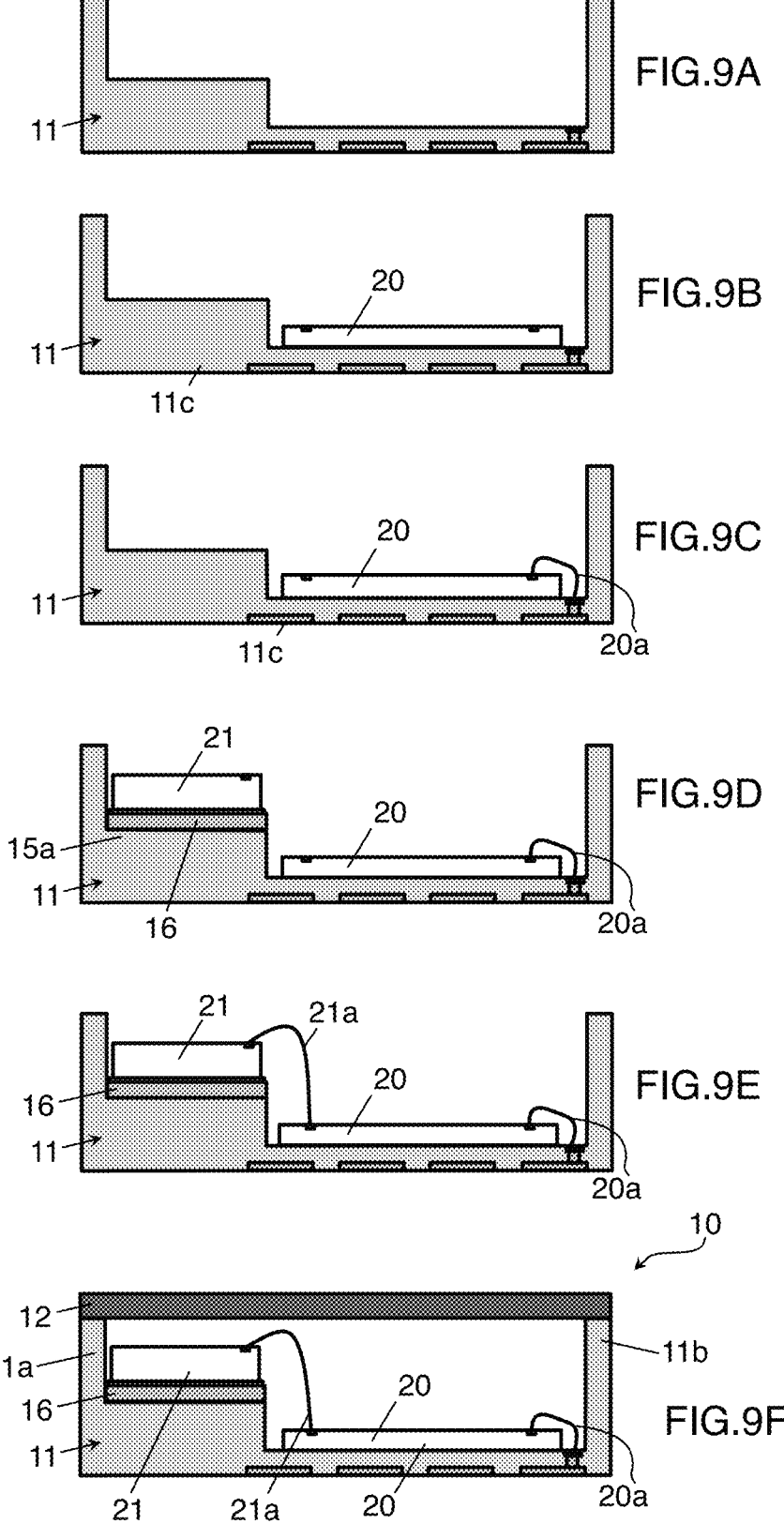
FIG. 9A is a cross sectional view of the package itself of the sensor package of FIG. 6 at the beginning of a manufacturing process flow.
FIG. 9B is a cross sectional view of the sensor package of FIG. 6 during manufacturing with the ASIC mounted to the top surface of the bottom of the package.
FIG. 9C is a cross sectional view of the sensor package of FIG. 6 during manufacture after wire bonding has been formed between pads on the ASIC and pads on the bottom of the package.
FIG. 9D is a cross sectional view of the sensor package of FIG. 6 during manufacture, with the ceramic plate carrying the sensors having been mounted on the support defined within the sensor package.
FIG. 9E is a cross sectional view of the sensor package of FIG. 6 during manufacture after wire bonding has been formed between pads on the sensors and the pads on ASIC.
FIG. 9F is a cross sectional view of the sensor package of FIG. 6 during manufacture after the lid has been affixed to the package.

Now described with reference to FIGS. 9A-9F is a process flow for forming the sensor package 10' of FIG. 6. The process flow begins with the provision or formation of the package 11, as shown in FIG. 9A. Thereafter, the ASIC 20 is attached to the top surface of the package bottom 11c and the sensors 21, 22 are attached to the top surface of the plate 16 adjacent to each other, as shown in FIG. 9B.

Wire bonding 20a is then used to connect pad 20d on the top face of the ASIC 20 to corresponding pad 20b on the top surface of the package bottom 11c, as shown in FIG. 9C, and then the assembled plate 16 is mounted within the package 11 such that it rests on the support shelf 15a, as shown in FIG. 9D. This mounting of the plate 16 is accomplished by dispensing adhesive on the support shelf 15a positioning the plate 16 into the appropriate place, and then performing a curing. Next, wire bondings 21a, 22a are passed past the side end of the plate 16 and used to connect pads 21b, 22b on the top faces of the sensors 21, 22 to pads 20d, 20e on the top face of the ASIC 20, as shown in FIG. 9E. The lid 12 is then affixed over the tops of the sidewalls 11a, 11b to seal off the cavity 19 within the package 11, as shown in FIG. 9F. This completes the formation of the sensor package 10'.

Other embodiments of sensor packages and process flows for manufacturing those embodiments are now described. Beginning with the embodiment of the sensor package 10" of FIG. 10, the ASIC 20 may be embedded within the plate 16, with the sensors 21 and 22 being attached to opposite faces of the ASIC 20 (wherein techniques known to those skilled in the art are used for encapsulating the ASIC 20 within the plate with coplanar upper and lower surfaces). In greater detail, as shown, the plate 16 is affixed to and extends across the tops of the sidewalls 11a, 11b to seal off the cavity 19, with the ASIC 20 being embedded in a central location within the plate 16. Sensor 21 is attached to the top face of the ASIC 20 and wire bonding 21a is connected to and extends between pad 21b on the top face of the sensor 21 and corresponding pad 20d on the top face of the ASIC 20. A wire bonding 20j connects pad 20i on the top face of ASIC 20 to pad 20k on the top surface of the plate 16. Pad 20k on the top surface of the plate 16 is connected to pad 20m on the bottom surface of the plate 16 by via 20l, and wire bonding 20a connects pad 20m on the bottom surface of the plate 16 to pad 20b on the top surface of the bottom 11c of the package 11. Sensor 22 is attached to the bottom face of the ASIC 20 and wire bonding 22a is connected to and extends between pad 22b on the top face of the sensor 22 and corresponding pad 20n on the bottom surface of the plate 16. Via 20g connects pad 20n on the bottom surface of the plate 16 to pad 20o on the top surface of the plate 16, and a wire bonding 20h connects the pad 20o on the top surface of the plate 16 to corresponding pad 20e on the top face of the ASIC 20.

Figures 10, 11A, 11B, 11C, 11D, 11E, 11F:
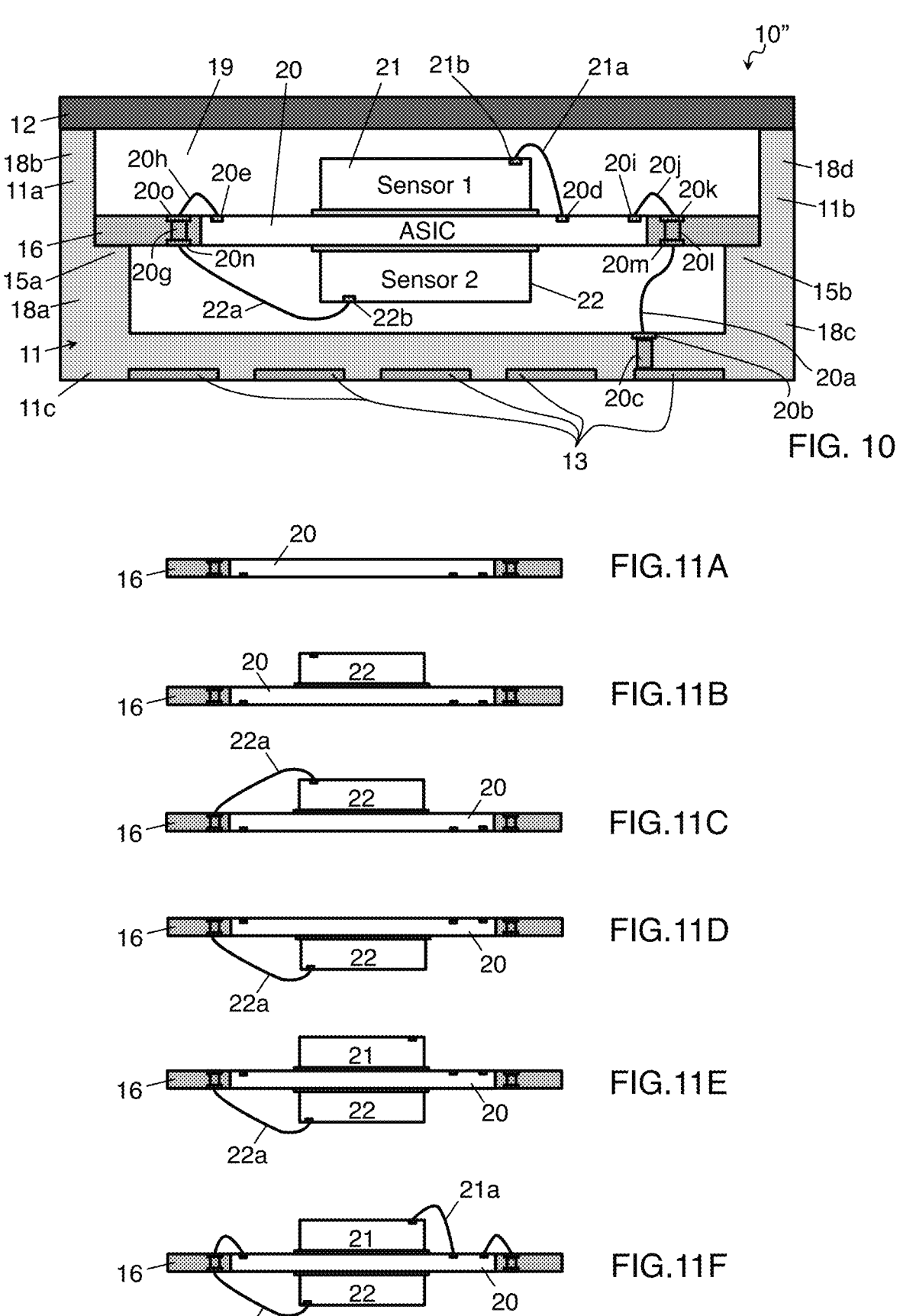
FIG. 10 is a cross sectional view of another sensor package described herein, showing the mounting of the sensors and ASIC within the package.
FIG. 11A is a cross sectional view of the ceramic plate of the sensor package of FIG. 10 during manufacture, with the ceramic plate having the ASIC embedded therein.
FIG. 11B is a cross sectional view of the ceramic plate of the sensor package of FIG. 10 during manufacture with a second sensor mounted to the bottom surface of the ceramic plate.
FIG. 11C is a cross sectional view of the sensor package of FIG. 10 during manufacture after wire bonding has been formed between the second sensor and the plate.
FIG. 11D is a cross sectional view of the sensor package of FIG. 10 during manufacture after flipping.
FIG. 11E is a cross sectional view of the sensor package of FIG. 10 during manufacture after mounting of a first sensor to the top surface of the ceramic plate.
FIG. 11F is a cross sectional view of the sensor package of FIG. 10 during manufacture after wire bonding has been formed between the first sensor and the ASIC.

Now described with reference to FIGS. 11A-11F is a process flow for forming the sensor package 10" of FIG. 10. The process flow begins with the provision of formation of the plate 16 as having the ASIC 20 embedded therein, as shown in FIG. 11A. Thereafter, the sensor 22 is attached to the bottom face of the ASIC 20, as shown in FIG. 11B, and then a wire bonding 22*a* is connected to and extends between pad 22*b* on the top face of the sensor 22 and corresponding pad 20*f* on the bottom face of the plate 16, as shown in FIG. 11C.

Figure 11G:
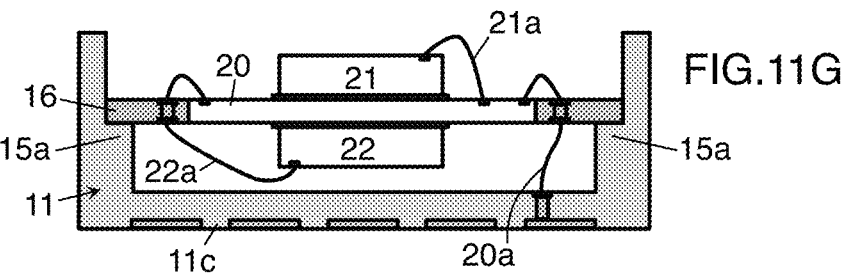
FIG. 11G is a cross sectional view of the sensor package of FIG. 10 during manufacture after the ceramic plate has been mounted on the supports defined within the sensor package and wire bonding has been formed between the plate and the bottom of the sensor package.
Figure 11H:
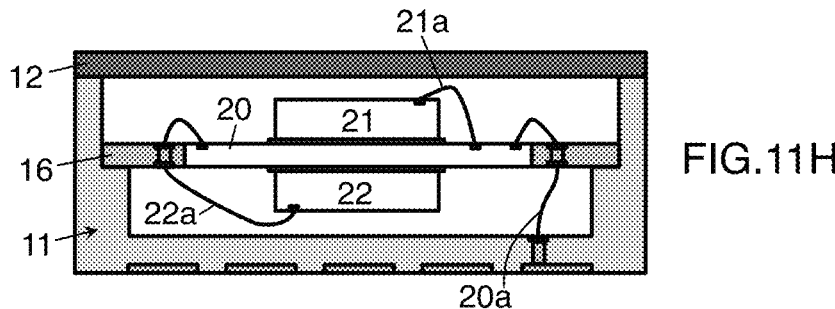
FIG. 11H is a cross sectional view of the sensor package of FIG. 10 during manufacture after the lid has been affixed to the package.

Next, the plate 16 is flipped, as shown in FIG. 11D, and the sensor 21 is attached to the top face of the ASIC 20, as shown in FIG. 11E. After that, a wire bonding 21*a* is connected to and extends between pad 21*b* on the top face of the sensor 21 and pad 20*d* on the top face of the ASIC 20, as shown in FIG. 11F. Additionally, wire bonding 20*j* connects pad 20*i* on the top face of the ASIC 20 to pad 20*k* on the top surface of the plate 16. The assembled plate 16 is mounted within the package 11 such that it rests on and extends between the support shelves 15*a*, 15*b*, as shown in FIG. 11G. This mounting of the plate 16 is accomplished by dispensing adhesive on the support shelves 15*a*, 15*b*, positioning the plate 16 into the appropriate place, and then performing a curing. During this step, a wire bonding 20*a* is connected to and extends between pad 20*m* on the bottom face of the ASIC 20 and pad 20*b* on the top surface of the package bottom 11*c*. The lid 12 is then affixed over the tops of the sidewalls 11*a*, 11*b* to seal off the cavity 19 within the package 11, as shown in FIG. 11H, thereby completing formation of the sensor package 10".

Figure 12:
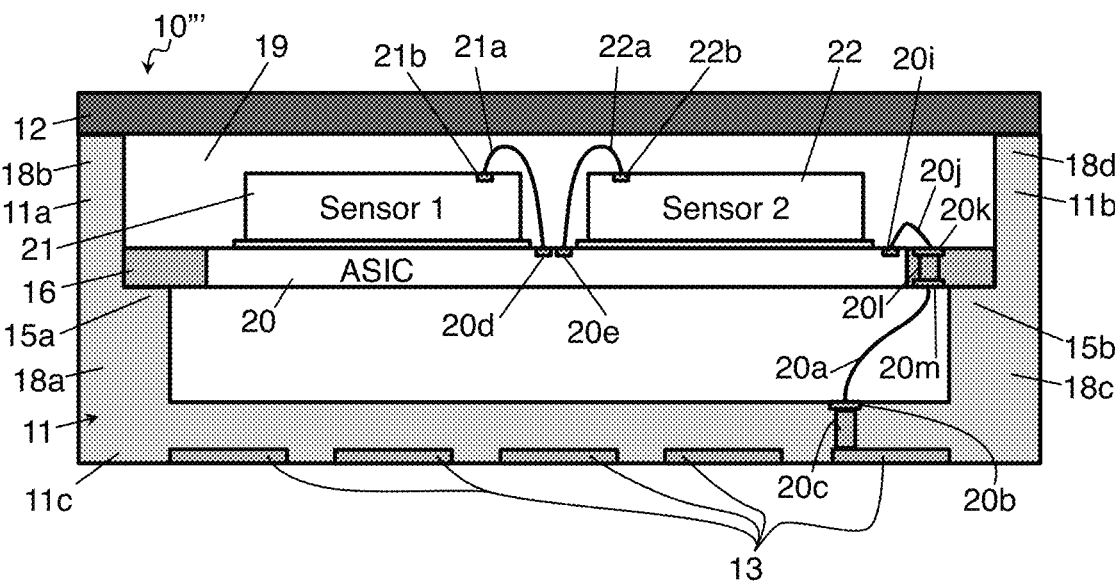
FIG. 12 is a cross sectional view of yet another sensor package described herein, showing the mounting of the sensors and ASIC within the package.

Instead of the sensors 21, 22 being attached to opposite faces of the ASIC 20 as in the sensor package 10" of FIG. 10, they may instead be attached to the same face of the ASIC 20 as shown in the sensor package 10''' of FIG. 12. In greater detail, as shown, the plate 16 is affixed to and extends across the tops of the sidewalls 11*a*, 11*b* to seal off the cavity 19, with the ASIC 20 being embedded in a central location within the plate 16. Sensors 21, 22 are attached to the top face of the ASIC 20. Wire bonding 21*a* is connected to and extends between the pad 21*b* on top face of the sensor 21 and corresponding pad 20*d* on the top face of the ASIC 20, and sensor 22 is attached to the top face of the ASIC 20 opposite to the sensor 21 and wire bonding 22*a* is connected to and extends between pad 22*b* on the top face of the sensor 22 and corresponding pad 20*e* on the top face of the ASIC 20. Wire bonding 20*j* connects pad 20*j* on the top face of the ASIC 20 to pad 20*k* on the top surface of the plate 16. Wire bonding 20*a* connects pad 20*m* on the bottom surface of the plate 16 to pad 20*b* on the top surface of the bottom 11*c* of the package 11. Via 20*l* connects pad 20*k* on the top surface of the plate 16 to pad 20*m* on the bottom surface of the plate 16. Via 20*c* connects pad 20*b* on the top surface of the bottom 11*c* of the package 11 to pad 13 on the bottom surface of the bottom 11*c* of the package 11.

Now described with reference to FIGS. 13A-13E is a process flow for forming the sensor package 10''' of FIG. 12. The process flow begins with the provision of formation of the plate 16 as having the ASIC 20 embedded therein, as shown in FIG. 13A. Thereafter, the sensors 21, 22 are attached to the top face of the ASIC 20, as shown in FIG. 13B, and then wire bondings 21*a*, 22*a* are connected to and extending between pads 21*a*, 22*a* on the top faces of the sensors 21, 22 and corresponding pads 20*d*, 20*e* on the top face of the ASIC 20, as shown in FIG. 13C. Additionally, wire bonding 20*j* is connected between pad 20*i* on the top face of the ASIC 20 and pad 20*k* on the top surface of the plate 16.

Next, the assembled plate 16 is mounted within the package 11 such that it rests on and extends between the support shelves 15*a*, 15*b*, as shown in FIG. 13D. This mounting of the plate 16 is accomplished by dispensing adhesive on the support shelves 15*a*, 15*b*, positioning the plate 16 into the appropriate place, and then performing a curing. During this step, a wire bonding 20*a* is connected to and extends between pad 20*m* on the bottom surface of the plate 16 and corresponding pad 20*b* on the top surface of the package bottom 11*c*. The lid 12 is then affixed over the tops of the sidewalls 11*a*, 11*b* to seal off the cavity 19 within the package 11, as shown in FIG. 13E, thereby completing formation of the sensor package 10'''.

Figure 14A:
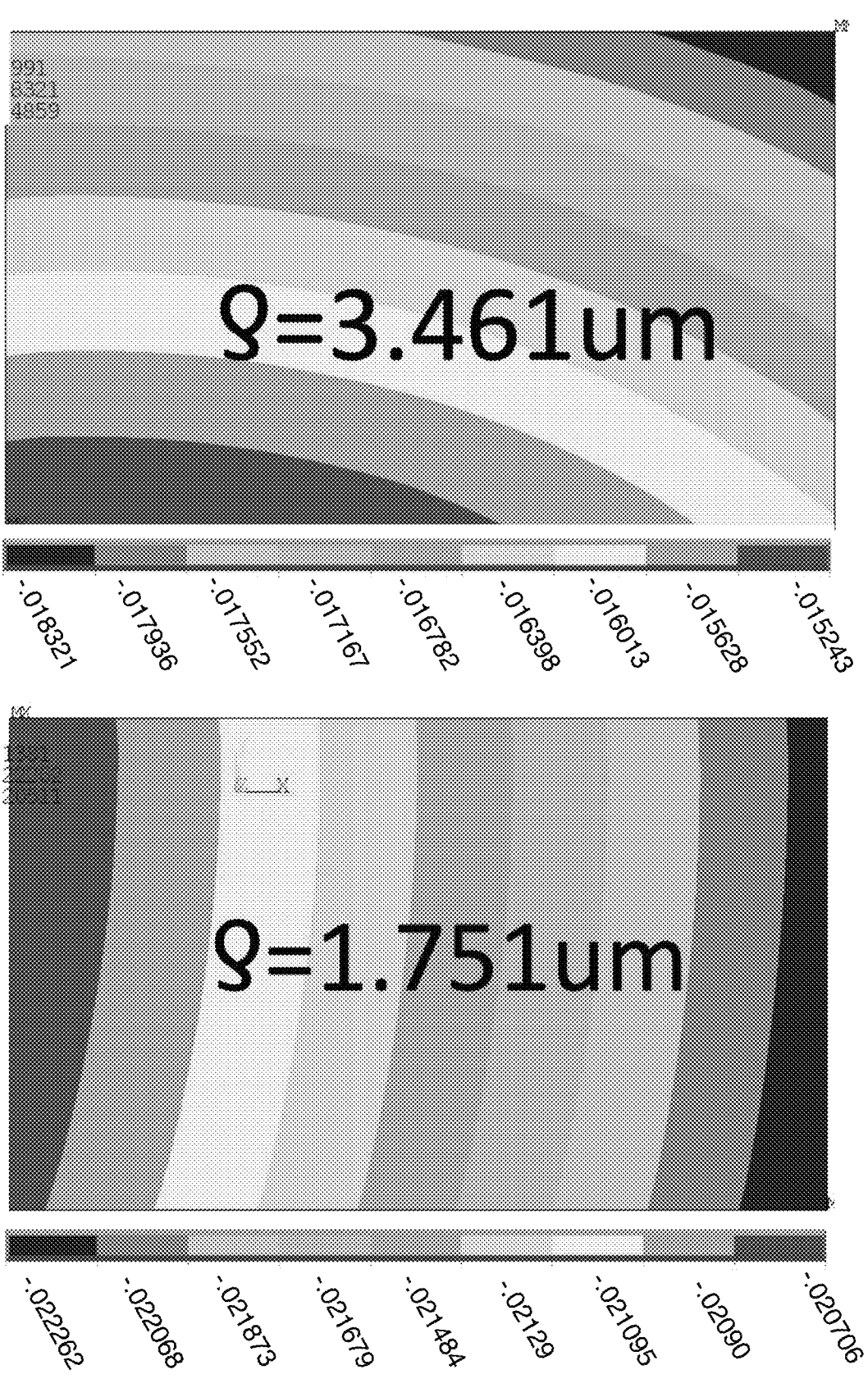
FIG. 14A-14B are a series of contour plots comparing the stresses placed on the sensors in prior art packages after soldering to the stresses placed in the sensors in the packages disclosed herein after soldering.
Figure 14B:
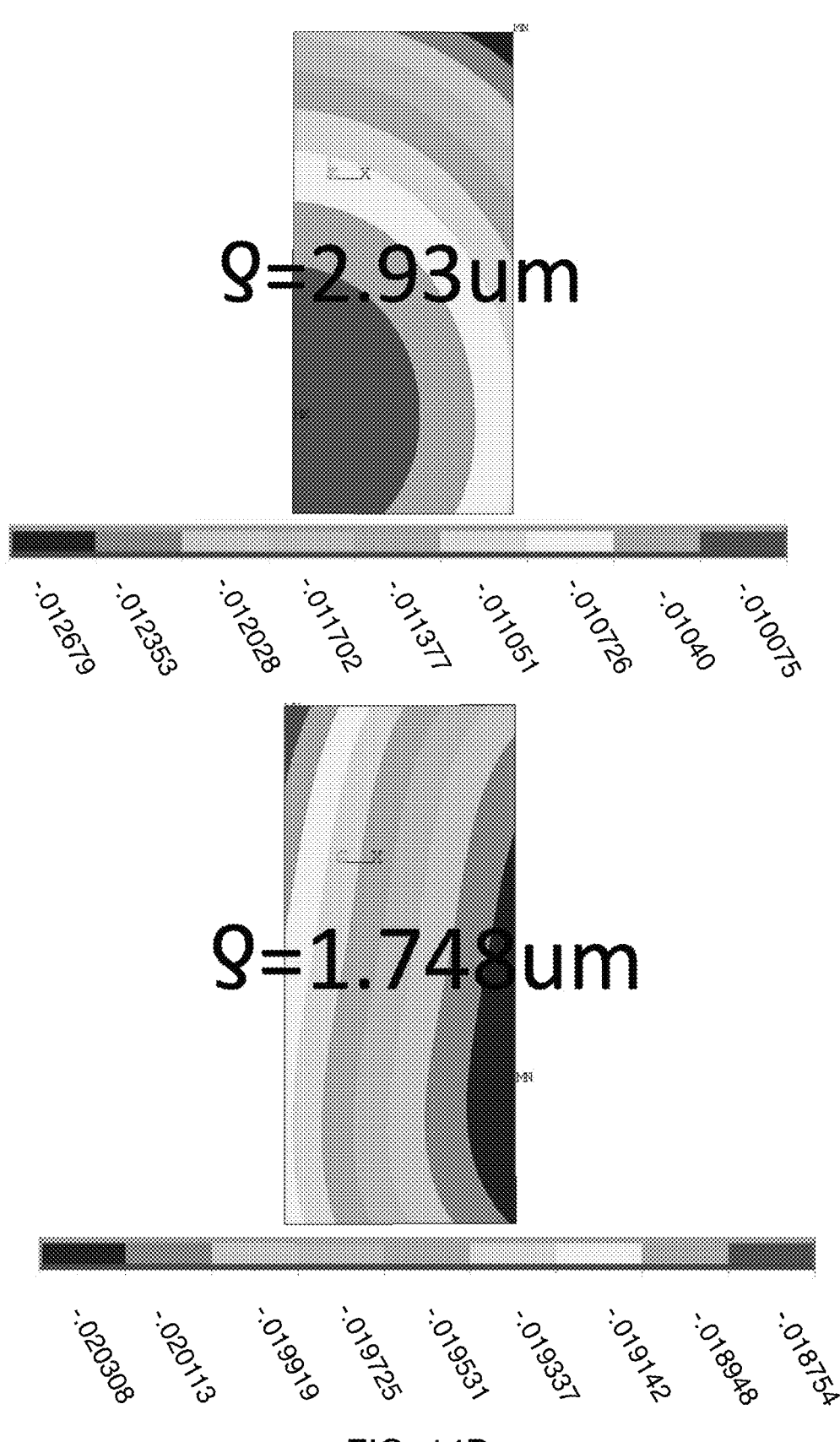

As has been explained, the sensor packages 10, 10', 10", 10''' described herein reduce the mechanical stresses placed on the sensors 21, 22. In fact, this reduction has been found by the Inventors to be on the order of 40.34% to 49.4%, as shown in the graphs of FIGS. 14A and 14B that show the deformation of the sensors 21, 22 as a result from stresses imparted by being soldered to a PCB.

Finally, it is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A sensor package, comprising:

a packaging comprising a package bottom, first and second sidewalls extending upwardly from first and second opposite sides of the package bottom, and third and fourth sidewalls extending upwardly from third and fourth opposite sides of the package bottom, wherein the first, second, third, and fourth sidewalls and the package bottom define a cavity;

an integrated circuit attached to the package bottom;

a plate extending between at least two from among the first, second, third, and fourth sidewalls within the cavity and being spaced apart from the package bottom;

at least one sensor attached to a top surface of the plate;

wire bondings electrically connecting pads on a top face of the at least one sensor to corresponding pads on a top face of the integrated circuit; and a lid extending across and between the first, second, third, and fourth sidewalls to thereby close the cavity.

2. The sensor package of claim 1, wherein the plate extends between the first and second sidewalls and has an opening formed therein; and wherein the wire bondings pass through the opening to electrically connect the pads on the top face of the at least one sensor to the corresponding pads on the top face of the integrated circuit.

3. The sensor package of claim 2:

wherein the first sidewall comprises a first portion extending upwardly from the first side of the package bottom and a second portion extending upwardly from a distal end of the first portion, with the second portion being thinner than the first portion in a stair-stepped shape so as to define a first support shelf;

wherein the second sidewall comprises a first portion extending upwardly from the second side of the package bottom and a second portion extending upwardly from a distal end of the second portion, with the second portion of the second sidewall being thinner than the first portion of the second sidewall in a stair-stepped shape so as to define a second support shelf, and wherein the plate is carried by and extends between the first and second support shelves.

4. The sensor package of claim 1:

wherein the plate extends between the first and second sidewalls and has an opening formed therein;

wherein the at least one sensor comprises first and second sensors attached to the top surface of the plate on opposite sides of the opening; and wherein the wire bondings comprise: first wire bondings passing through the opening to electrically connect the pads on the top face of the first sensor to the corresponding pads on the top face of the integrated circuit; and second wire bondings passing through the opening to electrically connect the pads on the top face of the second sensor to the corresponding pads on the top face of the integrated circuit.

5. The sensor package of claim 1, wherein the packaging and plate are constructed from ceramic.

6. The sensor package of claim 1, wherein the lid is constructed from metal.

7. The sensor package of claim 1, wherein the integrated circuit is an application specific integrated circuit (ASIC).

8. The sensor package of claim 1, further comprising:

vias formed within the package bottom to electrically connect pads on a top surface of the package bottom to corresponding pads on a bottom surface of the package bottom; and additional wire bondings electrically connecting the pads on the top surface of the package bottom to corresponding pads on the top face of the integrated circuit.

9. The sensor package of claim 1, wherein the plate extends between the third and fourth sidewalls, adjacent to the first sidewall; and wherein the wire bondings extend past a side end of the plate to electrically connect the pads on the top face of the at least one sensor to the corresponding pads on the top face of the integrated circuit.

10. The sensor package of claim 9, wherein the plate is sized to extend outwardly from the first sidewall toward the second sidewall but not reach the second sidewalls.

11. The sensor package of claim 9:

wherein the first sidewall comprises a first portion extending upwardly from the first side of the package bottom and a second portion extending upwardly from a distal end of the first portion, with the second portion being thinner than the first portion in a stair-stepped shape so as to define a first support shelf; and wherein the plate is carried by the first support shelf.

12. The sensor package of claim 11, wherein the second sidewall has a substantially constant thickness.

13. The sensor package of claim 1:

wherein the plate extends between the third and fourth sidewalls, adjacent to the first sidewall, with the plate being sized to extend outwardly from the first sidewall toward the second sidewall but not reach the second sidewall;

wherein the at least one sensor comprises first and second sensors attached to the top surface of the plate; and wherein the wire bondings comprise: first wire bondings extending past a side end of the plate to electrically connect the pads on the top face of the first sensor to the corresponding pads on the top face of the integrated circuit; and second wire bondings extending past the side end of the plate to electrically connect the pads on the top face of the second sensor to the corresponding pads on the top face of the integrated circuit.

14. A semiconductor device package, comprising:

a packaging having a package bottom and sidewalls extending upwardly from the package bottom to define a cavity;

an integrated circuit attached to the package bottom within the cavity;

at least one sensor attached within the cavity; and a plate extending between at least two of the sidewalls within the cavity and spaced apart from the package bottom, the plate having an opening formed therein; and wire bondings passing through the opening to electrically connect pads on a top face of the at least one sensor to corresponding pads on a top face of the integrated circuit.

15. The semiconductor device package of claim 14, wherein the at least one sensor comprises first and second sensors attached to a top surface of the plate.

16. The semiconductor device package of claim 15, wherein the first and second sensors are positioned on opposite sides of an opening formed in the plate.

17. The semiconductor device package of claim 14, wherein the at least one sensor comprises a microelectromechanical systems (MEMS) device.

18. The semiconductor device package of claim 14, wherein the packaging and plate are constructed from ceramic.

19. The semiconductor device package of claim 14, wherein the integrated circuit comprises an application specific integrated circuit (ASIC).

* * * * *